United States Patent
Murata

(10) Patent No.: US 9,537,481 B2
(45) Date of Patent: Jan. 3, 2017

(54) DC INSULATION SEMICONDUCTOR RELAY DEVICE

(75) Inventor: Yasuhito Murata, Otsu (JP)

(73) Assignee: OPTEX CO., LTD., Shiga (JP)

( * ) Notice: Subject to any disclaimer, the term of this patent is extended or adjusted under 35 U.S.C. 154(b) by 480 days.

(21) Appl. No.: 14/118,786

(22) PCT Filed: May 30, 2012

(86) PCT No.: PCT/JP2012/063902
§ 371 (c)(1),
(2), (4) Date: Nov. 19, 2013

(87) PCT Pub. No.: WO2012/169401
PCT Pub. Date: Dec. 13, 2012

(65) Prior Publication Data
US 2014/0091854 A1    Apr. 3, 2014

(30) Foreign Application Priority Data
Jun. 6, 2011    (JP) ................ 2011-126228

(51) Int. Cl.
*H01H 47/00* (2006.01)
*H03K 17/94* (2006.01)
(Continued)

(52) U.S. Cl.
CPC ........... *H03K 17/941* (2013.01); *G01J 1/46* (2013.01); *G01J 5/34* (2013.01); *H03K 17/689* (2013.01); *H03K 17/6874* (2013.01); *G08B 13/19* (2013.01)

(58) Field of Classification Search
CPC  H03K 17/941; H03K 17/6874; H03K 17/689; G01J 1/46; G01J 5/34; G08B 13/19
(Continued)

(56) References Cited

U.S. PATENT DOCUMENTS 4,575,642 A    3/1986  Hochreutiner et al.
4,950,918 A    8/1990  O'Breartuin et al.
(Continued)

FOREIGN PATENT DOCUMENTS

AU          613467 B    10/1989
CN      201142766 Y    10/2008
(Continued)

OTHER PUBLICATIONS

JP 11-195972 A, English Translation, downloaded Mar. 21, 2016.*
(Continued)

*Primary Examiner* — Hal Kaplan
(74) *Attorney, Agent, or Firm* — Sughrue Mion, PLLC

(57) ABSTRACT

A semiconductor relay device (1) includes a signal input unit (2) for inputting an alternating current signal for relay driving purpose, a direct current insulation member (3) for blocking a direct current electricity of the alternating current signal, a voltage multiplying circuit (5) for multiplying the signal voltage, after the direct current electricity has been blocked, by an integer number, and a relay circuit (4) including two metal-oxide semiconductor field-effect transistors (6, 7) having respective sources connected with each other and connected in a reverse series with each other and also having respective gates connected with each other. Those metal-oxide semiconductor field-effect transistors (6, 7) are caused to undergo a bidirectional ON-Off operation when the respective gates of those metal-oxide semiconductor field-effect transistors (6, 7) are brought into a conducting state by a signal of which voltage has been multiplied by the voltage multiplying circuit (5).

5 Claims, 5 Drawing Sheets

(51) Int. Cl.
*H03K 17/687* (2006.01)
*H03K 17/689* (2006.01)
*G01J 1/46* (2006.01)
*G01J 5/34* (2006.01)
*G08B 13/19* (2006.01)

(58) Field of Classification Search
USPC .......................................................... 307/116
See application file for complete search history.

(56) References Cited

U.S. PATENT DOCUMENTS

| | | | |
|---|---|---|---|
| 5,100,821 | A | 3/1992 | Fay |
| 5,138,177 | A | 8/1992 | Morgan et al. |
| 5,818,681 | A | 10/1998 | Futsuhara et al. |
| 2009/0014669 | A1 | 1/2009 | Sato et al. |

FOREIGN PATENT DOCUMENTS

| | | |
|---|---|---|
| DE | 3813536 A1 | 11/1989 |
| EP | 0092514 A1 | 10/1983 |
| EP | 0093018 A2 | 11/1983 |
| EP | 0398026 A2 | 11/1990 |
| FR | 2688363 A1 | 9/1993 |
| JP | 55-136720 A | 10/1980 |
| JP | 62-250718 A | 10/1987 |
| JP | 2-30206 B2 | 7/1990 |
| JP | 5-114847 A | 5/1993 |
| JP | 07-175980 A | 7/1995 |
| JP | 919043 A | 1/1997 |
| JP | 11-195972 A | 7/1999 |
| JP | 2007-141604 A | 6/2007 |
| JP | 2009-4522 A | 1/2009 |
| JP | 2009-063484 A | 3/2009 |
| JP | 2009-076252 A | 4/2009 |
| WO | 8303724 A1 | 10/1983 |

OTHER PUBLICATIONS

Communication dated Oct. 14, 2014, issued by the Japanese Patent Office in counterpart Application No. 2013519452.
Notification of Reason(s) for Rejection, dated Apr. 1, 2014, issued by the Japanese Patent Office in corresponding Japanese patent application No. 2013-519452.
International Preliminary Report on Patentability issued by the International Searching Authority in PCT/JP2012-063902 dated Dec. 27, 2013.
Communication dated Jan. 7, 2015 from the European Patent Office in counterpart application No. 12797491.3.

\* cited by examiner

DC INSULATION SEMICONDUCTOR RELAY DEVICE

CROSS REFERENCE TO THE RELATED APPLICATION

This application is based on and claims Convention priority to Japanese patent application No. 2011-126228, filed Jun. 6, 2011, the entire disclosure of which is herein incorporated by reference as a part of this application.

BACKGROUND OF THE INVENTION

Field of the Invention

The present invention relates to a semiconductor relay device of a direct current insulation type having two metal-oxide semiconductor field-effect transistors (MOSFETs) that are connected in series with each other.

Description of Related Art

In this type of insulation type semiconductor relay device, a metal oxide semiconductor (MOS) relay has been known which undergoes an ON-OFF operation by conducting a gate of a MOSFET upon impingement of rays of light, emitted from a light emitting diode (LED), upon a photo diode array. In this respect, see, for example, the patent document 1 listed below. The photo MOS relay referred to above is of a structure in which a signal input circuit and a relay circuit are optically connected with each other, but input and output thereof are electrically insulated.

It has also been known in the art that with the use of two metal-oxide semiconductor field-effect transistors (MOSETs) a signal input circuit and a relay circuit are insulated and separated from each other or are separated on a direct current basis by means of a capacitor. In this respect, see, for example, the patent document 2 listed below. The semiconductor relay device is generally used with a construction including a switching equipment, built therein, and a control panel (CP) which is a relay output side equipment for receiving a relay output and concurrently supplies an electric power to the switching equipment, but if from the standpoint of the control panel (CP), at least a direct current (DC) insulation is possible, the circuit dependency with the switching equipment is dissolved and protection is made from an electric influence thereof.

The semiconductor relay device referred to above is built in a switching equipment of a type, which is required to be silent at the time of a relay operation, for example, in an object detecting sensor for detecting an object and is operable to cause the MOSFET to perform an ON-OFF operation on the basis of an alternating current signal for relay drive purpose that is based on an object detection under the control of a microcomputer (MC) to thereby allow a detection ON-OFF signal to the control panel (CP).

PRIOR ART LITERATURE

[Patent document 1] JP Laid-open Patent Publication No. 2009-004522

[Patent Document 2] Japanese Examined Patent Publication No. H02-30206

It has however been found that the photo MOS relay referred to above requires to be molded with a light shielding resinous material in order to inhibit an input of unnecessary external light after the optical system has been formed with a transparent resinous material and is therefore likely to result in an increase of the cost. Also, the control panel (CP) is available in various types including, inter alia, a GND common type, an electric power source common type and, depending on the type, a proper connection cannot be made in a switching equipment including the conventional semiconductor relay device, and, accordingly, a problem has been realized that universalization of the semiconductor relay device is difficult to achieve.

In addition, from the recent standpoint of restraint of an electric power consumption, the driving voltage of the microcomputer (MC) for the switching equipment having the semiconductor relay device built therein tends to be lowered and, therefore, a problem has been realized that the stabilized driving of the MOSFET is difficult to achieve.

SUMMARY OF THE INVENTION

In view of the foregoing, the present invention has for its primary object to provide a semiconductor relay device of a direct current insulation type capable of performing a definite operation with its cost reduced, which can be connected regardless of the type of a relay output side equipment and can be universally used.

In order to accomplish the foregoing object, the present invention provides a semiconductor relay device of a direct current insulation type, which includes a signal input unit to which an alternating current signal for relay driving purpose is inputted, a direct current insulation member to isolate a direct current of the alternating signal, a voltage multiplying circuit to multiply a signal voltage, after the insulation of the direct current, an integer number, and a relay circuit including two metal-oxide semiconductor field-effect transistors having respective sources connected with each other and connected in a reverse series and also having respective gates connected with each other. Those metal-oxide semiconductor field-effect transistors are caused to undergo a bidirectional ON-Off operation when the respective gates of those metal-oxide semiconductor field-effect transistors are brought into a conducting state by a signal of which voltage has been multiplied by the voltage multiplying circuit.

According to the present invention, since the direct current insulation member blocks the direct current electricity of the alternating current signal for relay driving purpose, the realization of the direct current insulation between the signal input unit and the relay circuit is effective to resolve the circuit dependency of a relay output side machinery and, also, since the voltage multiplying circuit multiplies the signal voltage after the direct current electricity insulation by a integer number, the supply of a signal representative of the multiplied voltage to each of the gates is effective to stably actuate the metal-oxide semiconductor field-effect transistor in correspondence to the realization of a low voltage of the signal voltage. Accordingly, it is possible to allow the device to be assuredly operated and also to reduce the cost and, regardless of the type of relay output side machinery, connection is possible and it can be used universally.

In a preferred embodiment of the present invention, the direct current insulation member referred to above may be employed in the form of a capacitor or a transformer. Accordingly, the direct current insulation can be achieved at a low cost.

In another preferred embodiment of the present invention, the voltage multiplying circuit referred to above may be a voltage doubling circuit or a voltage triple circuit. Accordingly, a further assured operation can be enabled.

In a further preferred embodiment of the present invention, it is built in an object detecting sensor that is controlled by a microcomputer, in which case the metal-oxide semiconductor field-effect transistors undergoes an ON-Off operation under the control of the microcomputer through a drive by the alternating current signal, based on an object detection, to thereby allow it to output a detection ON-OFF signal to a relay output side machinery. Accordingly, the semiconductor relay device can be interfaced with a low voltage microcomputer. It is to be noted that the object detecting sensor referred to above is preferably a security sensor.

Any combination of at least two constructions, disclosed in the appended claims and/or the specification and/or the accompanying drawings should be construed as included within the scope of the present invention. In particular, any combination of two or more of the appended claims should be equally construed as included within the scope of the present invention.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DESCRIPTION OF PREFERRED EMBODIMENTS

Figure 1:
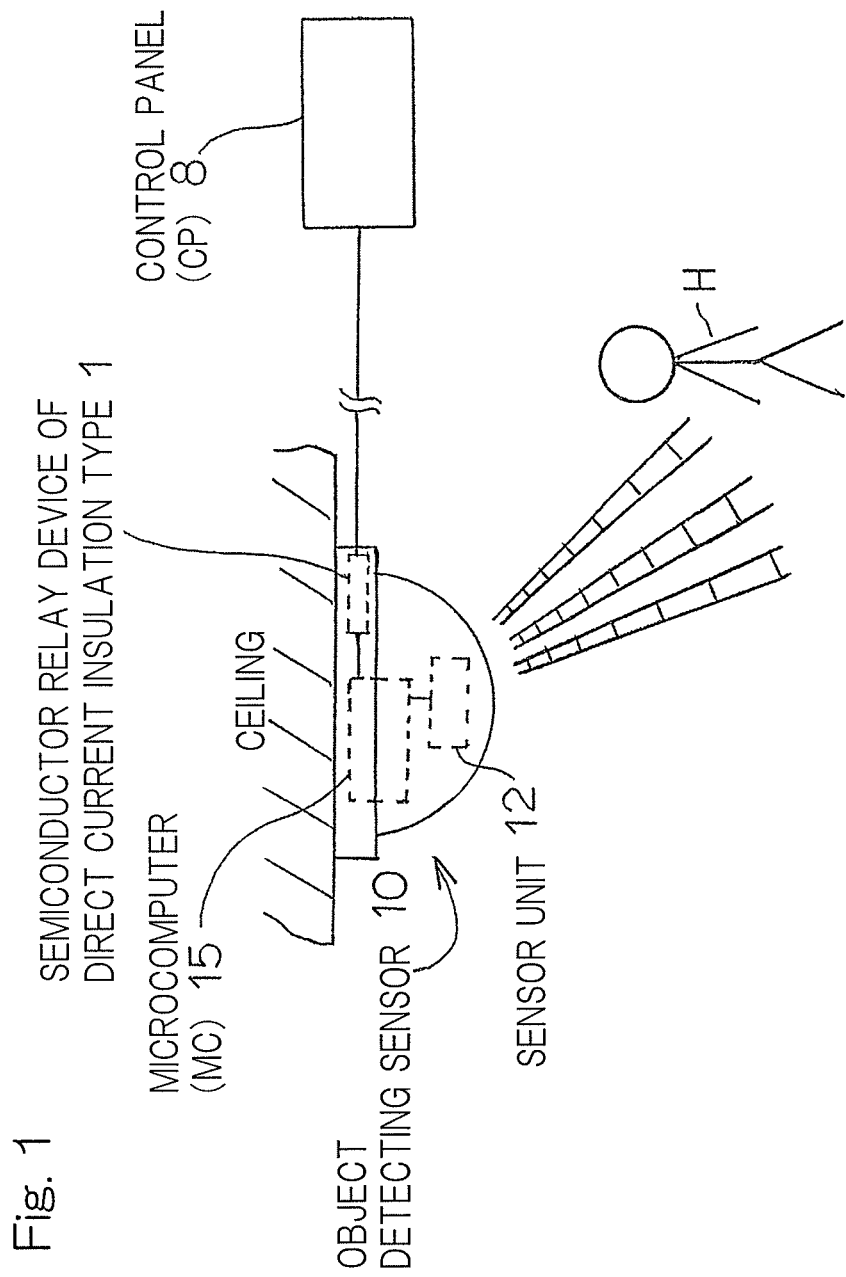
FIG. 1 is a side view showing an object detecting sensor having a semiconductor relay device of direct current insulation type designed in accordance with a preferred embodiment of the present invention is incorporated therein.

Hereinafter a preferred embodiment of the present invention will be described in detail with reference to the accompanying drawings. Of those drawings, FIG. 1 illustrates a side view of an object detecting sensor 10, which is a switching equipment having a semiconductor relay device 1 of a direct current insulation type designed in accordance with a preferred embodiment of the present invention is built therein. A control panel (CP) 8 is not only a relay output side machinery for receiving a relay output from the object detecting sensor 10, but also supplies an electric power to the object detecting sensor 10. In the embodiment now under discussion, the control panel (CP) 8 is of a GND common type in which in a connected condition with the electric power supplied to the semiconductor relay device 1, GND (ground) is common.

The object detecting sensor 10 referred to above is in the form of, for example, a passive type infrared (PIR) sensor affixed to, for example, a ceiling and is of a type in which infrared energies emitted from, for example, a human body H or the like entering a detection area are collected by an optical system and then impinge upon a corresponding sensor unit (pyroelectric element) 12 and a detection signal detected by the pyroelectric element 12 is subjected by a microcomputer (MC) 15 to a signal detecting process so that an intruder H can be detected.

Figure 2:
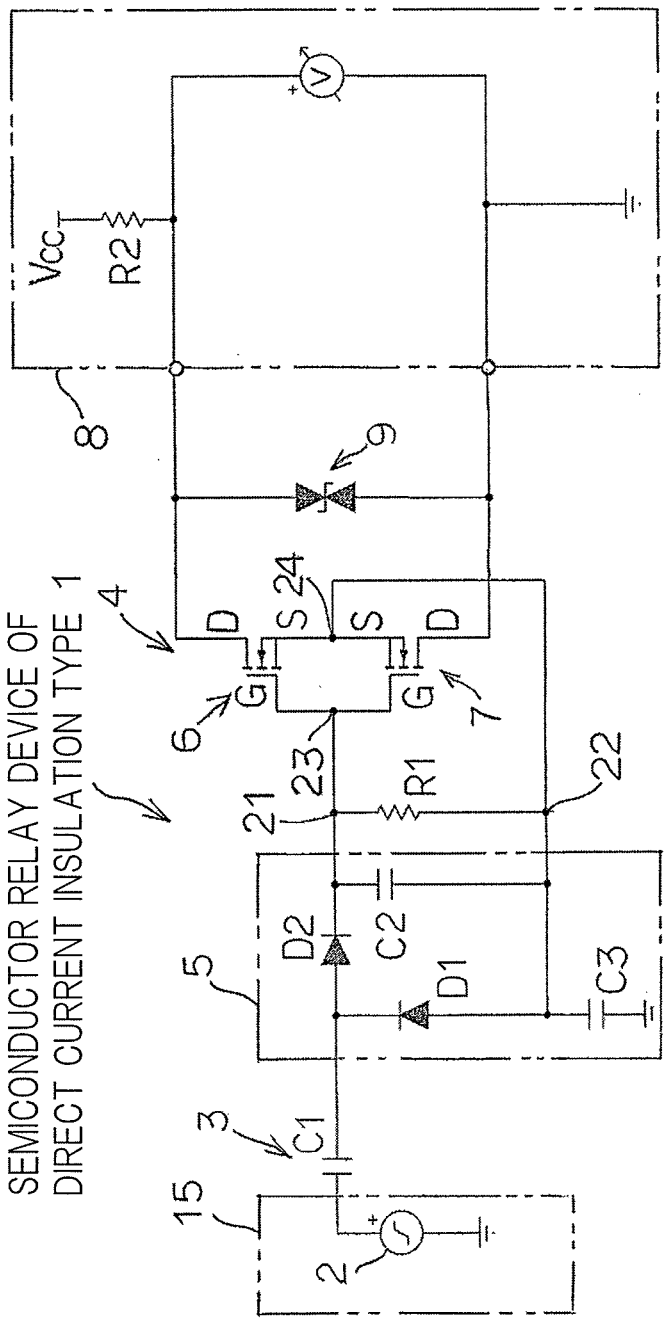
FIG. 2 is a circuit diagram showing one example of the construction including the semiconductor relay device of direct current insulation type according to the preferred embodiment of the present invention.

FIG. 2 illustrates a circuit diagram showing one example of the construction including the semiconductor relay device 1 of the direct current insulation type according to the preferred embodiment of the present invention. The semiconductor relay device 1 is made up of a signal input unit 2 to which an alternating current signal for relay driving purpose is inputted, a direct current insulation member 3 for blocking a direct current electricity of the alternating current signal, a voltage multiplying circuit 5 for doubling a signal voltage after the blocking of the direct current electricity, a relay circuit 4 including two n-type metal-oxide semiconductor field-effect transistors (MOSFETs) 6 and 7 having their sources S, for example, connected with each other and connected in reverse series relative to each other, and a protection circuit 9 for protecting the metal-oxide semiconductor field-effect transistors (MOSFETs) 6 and 7. It is to be noted that in place of the n-type metal-oxide semiconductor field-effect transistors (MOSFETs), p-type metal-oxide semiconductor field-effect transistors may be employed.

In the object detecting sensor 10 in the form of, for example, a security sensor, which has received an electric power supplied from the control panel (CP), on the basis of the detection of an intruder H under the control of the microcomputer (MC) 15, an alternating current signal (rectangular wave output) for relay driving purpose is inputted through the signal input unit 2. For the reduction of the electric power consumed, the driving voltage for the microcomputer (MC) 15 is lowered and, for example, the driving voltage is set to, for example, 2 V by means of a regulator (not shown), relative to the voltage of 12 v from an electric power source Vcc of the control panel (CP) 8 and the alternating current signal of 2 V based on the detection of the intruder H is inputted to the voltage multiplying circuit 5 through the direct current insulation member 3.

The direct current insulation member 3 is in the form of, for example, the capacitor C1 and performs a direct current insulation between the signal input unit 2 and the relay circuit 4 to enable the electric power supply by means of an AC coupling. In the present invention, since the electric power required for a gate drive of each of the metal-oxide semiconductor field effect transistors (MOSFETs) 6 and 7 is extremely low, an inexpensive chip capacitor can be employed.

It is to be noted that for the direct current insulating member, a transformer can be employed in place of the capacitor C1. In this case, the use of a transformer of a type, in which two three-dimensional coils are formed by means of patterning and an alternating current power can be supplied by means of mutual inductances of them, not the transformer of a wire winding structure, is preferred. By so doing, as compared with the use of the transformer of the wire winding structure, a low cost can be achieved. Similarly, in the present invention, the electric power required for the gate drive of each of the metal-oxide semiconductor field effect transistors (MOSFETs) 6 and 7 is extremely low and, therefore, the inductance of the transformer can be suppressed to a minimized value.

The voltage multiplying circuit 5 referred to previously is made up of, for example, a second diode D2 connected in series with the capacitor C1 which is the direct current insulation member 3, a first diode D1 and a voltage multiplying capacitor C2 connected parallel to each other across the second diode D2, and a capacitor C3 connected at one terminal with a junction between the first diode D1 and the voltage multiplying capacitor C2 and at the opposite terminal grounded. The first diode D1 has a cathode connected with the anode of the second diode D2 and the cathode of the first diode D1 and the capacitor C3 are connected with each other. The first diode D1 is brought into a conducting state, when a signal in which the alternating current signal is insulated from the direct current is a negative voltage, to allow the capacitor C3 to be charged, but the second diode D2 is brought into a conducting state, when it is a positive voltage, to allow the capacitor 3 to discharge, to thereby generate a voltage, which has been charged in the voltage multiplying capacitor C2, and a signal voltage of the same direction and the same voltage level as those of the voltage charged in the capacitor C2 with the consequence that a doubled signal voltage is formed.

One 21 of output terminals of the voltage multiplying circuit 5 and a point 23 of connection between the respective gates G of the metal-oxide semiconductor field-effect transistors (MOSFETs) 6 and 7 are connected with each other and the other 22 of the output terminals of the voltage multiplying circuit 5 and a point 24 of connection between respective sources S of the metal-oxide semiconductor field-effect transistors (MOSFETs) 6 and 7 are connected with each other, such that each of the gates G is brought into the conducting state in response to a signal, in which the voltage is doubled by the voltage multiplying circuit 5, to thereby allot those two metal-oxide semiconductor field-effect transistor (MOSFETs) 6 and 7 to undergo the ON OFF operation in bilateral directions. By the ON-OFF operation of those two metal-oxide semiconductor field-effect transistor (MOSFETs) 6 and 7, a detection ON-OFF signal is outputted to the control panel (CP) 8.

When each of the gate G terminals is in a non-conducting state, both of them are switched off since the potential the two metal-oxide semiconductor field-effect transistors (MOSFETs) 6 and 7 since the potential at the gate G terminal and the potential at the source S terminal are substantially equal to each other. However, when each of the gates G is in the conducting state, both of them are switched on since the potential at the gate G terminal is higher than that of the source S terminal.

Thus, since the direct current insulation member 3 serves to block the direct current electricity of the alternating signal for relay driving purpose, the realization of the direct current insulation between the signal input unit 2 and the relay circuit 4 is effective to resolve the circuit dependency of the control panel (CP) 8. In correspondence therewith, since the voltage multiplying circuit 5 serves to double the voltage of the signal after the direct current electricity insulation, the supply of the signal representative of the doubled voltage to each of the gates is effective to align with the low voltage microcomputer 15 to thereby stably actuate the metal-oxide semiconductor field-effect transistors 6 and 7. Also, since the semiconductor relay device 1 of the present invention makes no use of any photo MOSFET as compared with the photo MOS relay, reduction in cost is possible and, while the ON resistance of the photo MOSFET is generally high, the ON resistance can be reduced down to that in a mechanical relay.

The semiconductor relay device 1 of the present invention is such that owning to the use of the low ON resistance of a level comparable to that in the mechanical relay and the metal-oxide semiconductor field-effect transistors, not only can the direct current insulation be realized at a low cost, but also generation of noises from switches can be minimized to a value comparable to that occurring in the use of the photo MOS relay. It may occurs that the intruder H, when hearing a switching noise generated from the security sensor, may realize that his or her intrusion would have been detected, and, hence, the minimized generation of the switching noises makes it possible to avoid the possibility that the intruder H may suspect being monitored by the security sensor.

Figure 3:
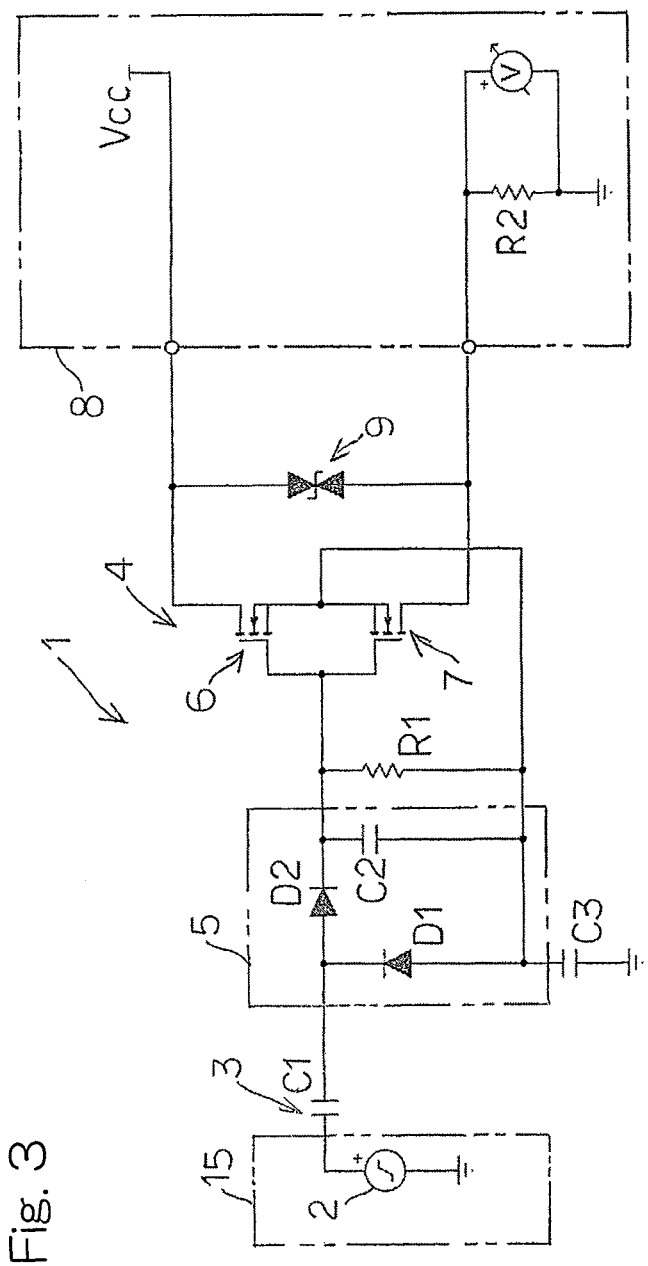
FIG. 3 is a circuit diagram showing another example of the construction including the semiconductor relay device of direct current insulation type according to the preferred embodiment of the present invention.

FIG. 3 illustrates a circuit diagram showing another example of the construction including the semiconductor relay device 1 of the direct current insulation type. The control panel (CP) 8 is of an electric power source common type in which in a condition in which the electric power is being supplied to the semiconductor relay device 1, the electric power source is commonly utilized. Other structural features are similar to those in the semiconductor relay device 1 shown in and described with particular reference to FIG. 2. Since the semiconductor relay device 1 is of a structure in which the direct current insulation is realized between the signal input unit 2 and the relay circuit 4 in a manner similar to that described in connection with the semiconductor relay device of FIG. 2, connection is possible even in the control panel (CP) of the electric power source common type regardless of the polarity on the relay output side in the control panel (CP) 8.

Figure 4:
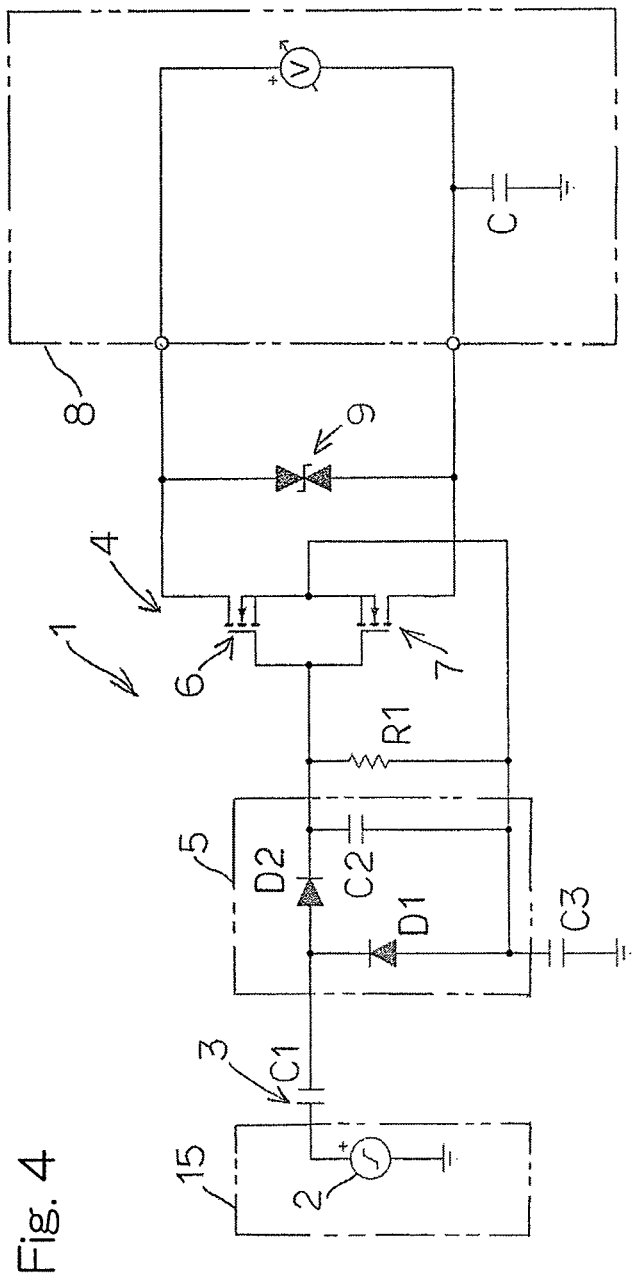
FIG. 4 is a circuit diagram showing a further example of the construction including the semiconductor relay device of direct current insulation type according to the preferred embodiment of the present invention.

FIG. 4 illustrates a further example of the construction including the semiconductor relay device 1 of the direct current insulation type. Since this object detecting sensor 10 has a battery built therein, the control panel (CP) 8 does not supply an electric power to the semiconductor relay device 1 and is of an electric power source insulation type. A capacitor C employed in the control panel (CP) 8 represents a stray capacitance. Other structural features are similar to those in the semiconductor relay device 1 shown in and described with particular reference to FIG. 2. Since the semiconductor relay device 1 is of a structure in which the direct current insulation is realized between the signal input unit 2 and the relay circuit 4 in a manner similar to that described in connection with the semiconductor relay device of FIG. 2, connection is possible even in the control panel (CP) of the electric power source insulation type regardless of the polarity on the relay output side in the control panel (CP) 8.

Figure 5:
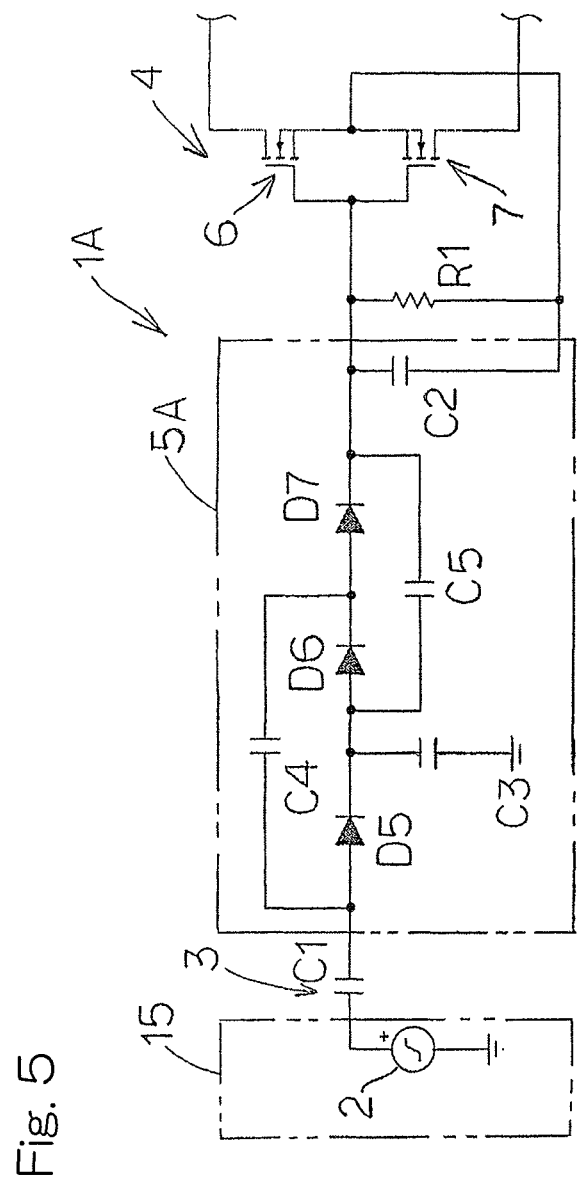
FIG. 5 is a circuit diagram showing a different example of a voltage multiplying circuit forming a part of the semiconductor relay device of direct current insulation type according to the preferred embodiment of the present invention.

FIG. 5 illustrates a circuit diagram showing a different example of the voltage multiplying circuit 5A forming a part of the semiconductor relay device 1A of direct current insulation type according to the present invention. This voltage multiplying circuit 5A is operable to triple the voltage of the signal in which the alternating current signal has been insulated from the direct current by the direct current insulation member 3. The voltage multiplying circuit 5A includes diodes D5 and D6 connected in series with the capacitor C1 which is the direct current insulation member 3, a capacitor C4 connected parallel to the series connected circuit of the diodes D5 and D6, a diode D7 connected in series with the diode D6, a capacitor C5 connected parallel to the series connected circuit of the diodes D6 and D7, a capacitor C3 at one terminal connected with a junction between the diodes D5 and D6 and at the opposite terminal grounded, and a voltage multiplying capacitor C2 connected parallel to a junction between the diode D7 and the capacitor C5.

At the outset, when the signal, in which the alternating current signal has been insulated from the direct current, is of a positive voltage, the diode D5 is brought in the conducting state to allow the capacitor C3 to be charged. Subsequently, the capacitor C3 discharges upon conduction of the diode D6 at the time of a negative voltage, resulting in the generation of the doubled signal voltage in the capacitor C4. And, at the time of the positive voltage the diode D5 is brought in the conducting state to allow the capacitor C3 to be charged and, at the same time, the doubled signal voltage in the capacitor C4 is moved to the capacitor C5 to allow just the signal voltage in the capacitor C3 and the doubled signal voltage in the capacitor C5 to be added to the voltage multiplying capacitor C2, resulting in the generation of the triple multiplied signal voltage. Since the respective gates G of the metal-oxide semiconductor field-effect transistors (MOSFETs) 6 and 7 are conducted in response to the signal of which voltage has been tripled, a further assured operation and reduction in cost of the semiconductor relay device 1A of the present invention can be realized.

As hereinabove described, according to the present invention, since the direct current insulation member 3 blocks the direct current electricity of the alternating current signal for relay driving purpose, the realization of the direct current insulation between the signal input unit 2 and the relay circuit 4 is effective to resolve the circuit dependency of the relay output side machinery (control panel) 8 and, also, since the voltage multiplying circuit 5 serves to multiply by an integer number the voltage of the signal after the direct current electricity insulation, the supply of the signal representative of the multiplied voltage to each of the gates is effective to stably operate the metal-oxide semiconductor field-effect transistors 6 and 7 in correspondence with the reduction in voltage of the signal voltage. Accordingly, a further assured operation and the reduction in cost of the semiconductor relay device 1 of the present invention can be realized and connection is possible and used universally regardless of the type of the relay output side machinery such as the control panel (CP) 8 referred to previously.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. By way of example, although in describing the preferred embodiment of the present invention, the semiconductor relay device 1 has been shown and described as built in the object detecting sensor 10 as the switching equipment, the present invention is not necessarily limited thereto and the semiconductor relay device of the present invention may be built in any other switching equipment that is controlled by the microcomputer.

Also, although in describing the preferred embodiment of the present invention, the semiconductor relay device 1 has been shown and described as supplied with the electric power supplied from the control panel (CP) 8, the present invention is not necessarily limited thereto and the semiconductor relay device of the present invention may be supplied with the electric power from any other device such as, for example, a lighting device.

Accordingly, such changes and modifications are, unless they depart from the scope of the present invention as delivered from the claims annexed hereto, to be construed as included therein.

REFERENCE NUMERAL

1 . . . Semiconductor relay device of direct current insulation type
2 . . . Signal input unit
3 . . . Direct current insulation member
4 . . . Relay circuit
5 . . . Voltage multiplying circuit
6, 7 . . . Metal-oxide semiconductor field-effect transistor
8 . . . Relay output side machinery (Control panel (CP))
10 . . . Object detecting sensor
15 . . . Microcomputer (MC)
H . . . Intruder

What is claimed is:

1. A semiconductor relay device of a direct current insulation type for use in an object detecting sensor, which comprises:
 a signal input unit to which an alternating current signal for relay driving purpose is inputted;
 a direct current insulation member to insulate a direct current signal component from the alternating current signal;
 a voltage multiplying circuit to multiply a signal voltage, after the insulation of the direct current signal component, by an integer number; and
 a relay circuit including two metal-oxide semiconductor field-effect transistors having respective sources connected with each other and connected in a reverse series and also having respective gates connected with each other, those metal-oxide semiconductor field-effect transistors being caused to undergo a bidirectional ON-OFF operation when the respective gates of those metal-oxide semiconductor field-effect transistors are brought into a conducting state by a signal of which voltage has been multiplied by the voltage multiplying circuit,
 wherein provision of the alternating current signal is controlled by a microcomputer of the object detecting sensor based on an object detection.

2. The semiconductor relay device of the direct current insulation type as claimed in claim 1, in which the direct current insulation member comprises a capacitor or a transformer.

3. The semiconductor relay device of the direct current insulation type as claimed in claim 1, in which the voltage multiplying circuit is a voltage doubling circuit or a voltage tripling circuit.

4. A semiconductor relay device of a direct current insulation type, which comprises:
 a signal input unit to which an alternating current signal for relay driving purpose is inputted;
 a direct current insulation member to insulate a direct current signal component from the alternating current signal;
 a voltage multiplying circuit to multiply a signal voltage, after the insulation of the direct current, current signal component, by an integer number; and
 a relay circuit including two metal-oxide semiconductor field-effect transistors having respective sources connected with each other and connected in a reverse series and also having respective gates connected with each other, those metal-oxide semiconductor field-effect transistors being caused to undergo a bidirectional ON-OFF operation when the respective gates of those metal-oxide semiconductor field-effect transistors are brought into a conducting state by a signal of which voltage has been multiplied by the voltage multiplying circuit, wherein the semiconductor relay device is built in an object detecting sensor that is controlled by a microcomputer, and wherein the semiconductor relay device outputs a detection ON-OFF signal to a relay output side machinery by causing the metal-oxide semiconductor field-effect transistors to undergo an ON-OFF operation through a drive by the alternating current signal the provision of which is controlled by the microcomputer based on an object detection.

5. The semiconductor relay device of the direct current insulation type as claimed in claim 4, in which the object detecting sensor is a security sensor.

* * * * *